(12) United States Patent
Oshige

(10) Patent No.: US 12,457,692 B2
(45) Date of Patent: Oct. 28, 2025

(54) SEMICONDUCTOR DEVICE HAVING AN INSULATING PORTION WITH A TOP SMALLER IN WIDTH THAN A DIAMETER OF A CONDUCTIVE PARTICLE, DISPLAY DEVICE, IMAGE CAPTURING DEVICE, AND ELECTRONIC APPARATUS

(71) Applicant: CANON KABUSHIKI KAISHA, Tokyo (JP)

(72) Inventor: Hidemasa Oshige, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 646 days.

(21) Appl. No.: 17/720,558

(22) Filed: Apr. 14, 2022

(65) Prior Publication Data
US 2022/0336549 A1   Oct. 20, 2022

(30) Foreign Application Priority Data
Apr. 15, 2021   (JP) .................... 2021-069265

(51) Int. Cl.
*H05K 3/32* (2006.01)
*H10K 59/121* (2023.01)
(Continued)

(52) U.S. Cl.
CPC ......... *H05K 3/323* (2013.01); *H10K 59/1213* (2023.02); *H10K 59/65* (2023.02);
(Continued)

(58) Field of Classification Search
CPC .. H10K 59/65; H10K 59/879; H10K 59/1213; H10K 59/873; H10K 59/131; H05K 3/323
(Continued)

(56) References Cited

U.S. PATENT DOCUMENTS

| 8,450,144 B2 * | 5/2013 | Sakata | H10D 30/6713 257/E21.46 |
| 2017/0069664 A1 * | 3/2017 | Nakamura | H10K 77/111 |

(Continued)

FOREIGN PATENT DOCUMENTS

| JP | 2000286300 A | 10/2000 |
| JP | 2004214374 A | 7/2004 |

(Continued)

OTHER PUBLICATIONS

Korean Office Action dated Mar. 20, 2025 in counterpart Korean Patent Appln. No. 10-2022-0044901.
(Continued)

*Primary Examiner* — Jami Valentine Miller
(74) *Attorney, Agent, or Firm* — Venable LLP

(57) ABSTRACT

A semiconductor device comprises a first substrate; a functional element arranged on a main surface of the first substrate; a terminal connected to an electrode electrically connected to the functional element and arranged on a second substrate different from the first substrate; an insulating portion configured to cover an end of the terminal; and a conductive film arranged on the terminal and the insulating portion and containing a conductive particle, wherein in a section perpendicular to the main surface of the first substrate, the insulating portion includes a top and lateral sides inclined with respect to the top, and a width of the top is smaller than a diameter of the conductive particle.

18 Claims, 13 Drawing Sheets

(51) Int. Cl.
  *H10K 59/65* (2023.01)
  *H10K 59/80* (2023.01)
  *H10K 59/131* (2023.01)

(52) U.S. Cl.
  CPC ......... *H10K 59/873* (2023.02); *H10K 59/879* (2023.02); *H10K 59/131* (2023.02)

(58) Field of Classification Search
  USPC .......................................................... 257/40
  See application file for complete search history.

(56) References Cited

U.S. PATENT DOCUMENTS

| | | | | |
|---|---|---|---|---|
| 2017/0154947 | A1* | 6/2017 | Nakamura | H10K 59/8722 |
| 2021/0191552 | A1* | 6/2021 | Bok | H10K 59/38 |
| 2021/0193769 | A1* | 6/2021 | Bok | H10K 59/60 |

FOREIGN PATENT DOCUMENTS

| | | |
|---|---|---|
| JP | 2005109023 A | 4/2005 |
| JP | 2010272775 A | 12/2010 |
| JP | 2013207115 A | 10/2013 |
| JP | 2015232660 A | 12/2015 |
| JP | 2020088066 A | 6/2020 |
| KR | 20180014203 A | 2/2018 |
| KR | 20200113957 A | 10/2020 |
| WO | 2018159186 A1 | 9/2018 |

OTHER PUBLICATIONS

Japanese Office Action dated Apr. 21, 2025 in counterpart Japanese Patent Appln. No. 2021-069265.
Japanese Office Action dated Jan. 10, 2025 in counterpart Japanese Patent Appln. No. 2021-069265.

* cited by examiner

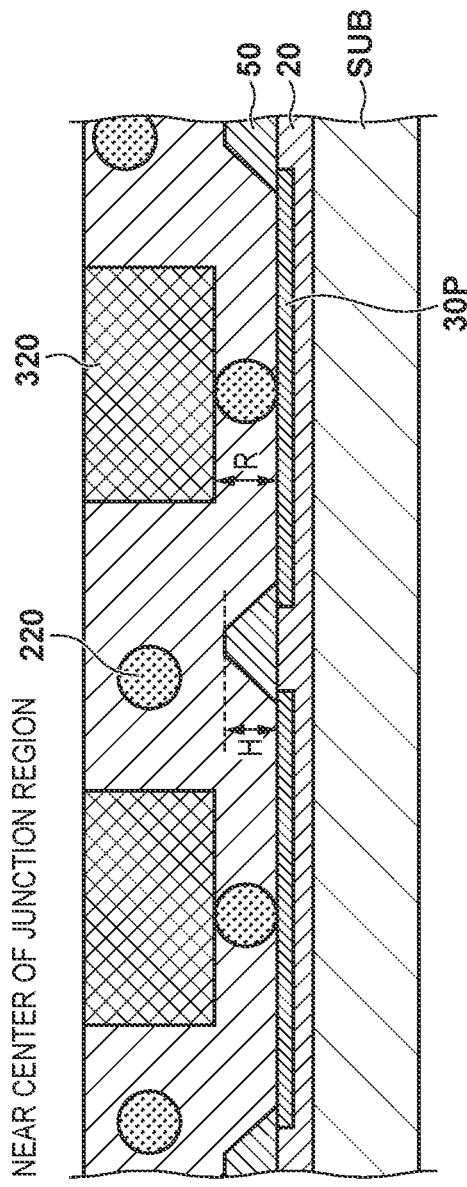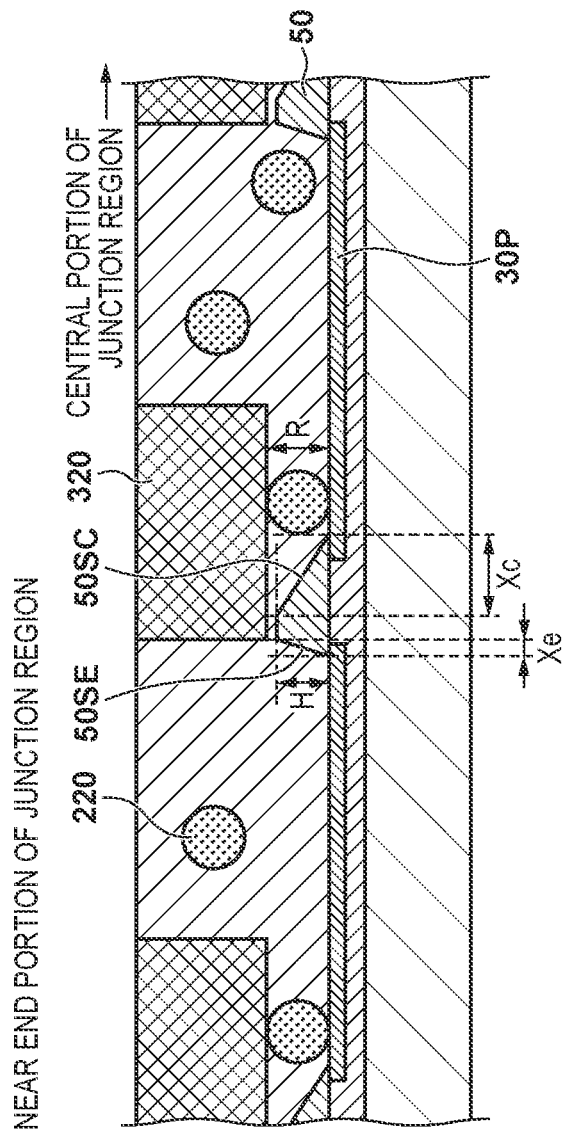
FIG. 4A
FIG. 4B

AFTER RESIST MASK FORMING

AFTER ETCH BACK

SEMICONDUCTOR DEVICE HAVING AN INSULATING PORTION WITH A TOP SMALLER IN WIDTH THAN A DIAMETER OF A CONDUCTIVE PARTICLE, DISPLAY DEVICE, IMAGE CAPTURING DEVICE, AND ELECTRONIC APPARATUS

BACKGROUND OF THE INVENTION

Field of the Invention

The present invention relates to a semiconductor device connected to a wiring board.

Description of the Related Art

A semiconductor device that performs image capturing or display includes an element substrate on which an element and external connection terminals are arranged, and the element substrate is connected to a wiring board for connection to an external circuit. The wiring board (for example, a flexible printed circuit (to be referred to as an FPC hereinafter)) is joined to the external connection terminals of the element substrate via an anisotropic conductive film (ACF).

In recent years, to reduce the size of the semiconductor device, it is necessary to decrease the pitch between external connection terminals to decrease the region of the external connection terminals. As the pitch between the external connection terminals decreases, a failure in junction caused by an alignment deviation between the wiring board and the external connection terminal of the element substrate occurs more easily.

Japanese Patent Laid-Open No. 2015-232660 (hereinafter PTL 1) discloses an arrangement in which an insulating portion is provided between external connection terminals on the element substrate side to function as a guide member with respect to a deviation of wiring of an FPC.

However, to cause the insulating portion between the external connection terminals to function as the guide member, it is necessary to align the wiring board and the element substrate so that an electrode of the wiring board is surely arranged on the external connection terminal of the element substrate. To do this, it is necessary to design the external connection terminals to be relatively wide in consideration of an alignment margin. As a result, it is difficult to decrease the pitch between the external connection terminals.

SUMMARY OF THE INVENTION

The present invention has been made in consideration of the above-described problem, and provides a semiconductor device that can reduce a conductive failure between an element substrate and a wiring board even if the electrodes of the wiring board are compression-bonded while deviating with respect to the terminals of the element substrate.

According to a first aspect of the present invention, there is provided a semiconductor device comprising: a first substrate; a functional element arranged on a main surface of the first substrate; a terminal connected to an electrode electrically connected to the functional element and arranged on a second substrate different from the first substrate; an insulating portion configured to cover an end of the terminal; and a conductive film arranged on the terminal and the insulating portion and containing a conductive particle, wherein in a section perpendicular to the main surface of the first substrate, the insulating portion includes a top and lateral sides inclined with respect to the top, and a width of the top is smaller than a diameter of the conductive particle.

According to a second aspect of the present invention, there is provided a semiconductor device comprising: a first substrate; a functional element arranged on a main surface of the first substrate; a terminal connected to an electrode electrically connected to the functional element and arranged on a second substrate different from the first substrate; an insulating portion configured to cover an end of the terminal; and a conductive film arranged on the terminal and the insulating portion and containing a conductive particle, wherein in a section perpendicular to the main surface of the first substrate, the insulating portion includes a top and lateral sides inclined with respect to the top, and a height from a surface of the terminal to the top is smaller than a diameter of the conductive particle.

According to a third aspect of the present invention, there is provided a semiconductor device comprising: a first substrate; a functional element arranged on a main surface of the first substrate; a terminal connected to an electrode electrically connected to the functional element and arranged on a second substrate different from the first substrate; an insulating portion configured to cover an end of the terminal; and a conductive film arranged on the terminal and the insulating portion and containing a conductive particle, wherein in a section perpendicular to the main surface of the first substrate, the insulating portion includes a top and lateral sides inclined with respect to the top, the lateral sides include a first inclined portion contacting the terminal and a second inclined portion connected to the first inclined portion, and a height from a surface of the terminal to a connecting portion between the first inclined portion and the second inclined portion is smaller than a diameter of the conductive particle.

According to a fourth aspect of the present invention, there is provided a display device comprising a plurality of pixels, wherein at least one of the plurality of pixels includes a semiconductor device defined above, and a transistor connected to the semiconductor device.

According to a fifth aspect of the present invention, there is provided an image capturing device comprising an optical unit including a plurality of lenses, an image sensor configured to receive light having passed through the optical unit, and a display unit configured to display an image captured by the image sensor, wherein the display unit includes a semiconductor device defined above.

According to a sixth aspect of the present invention, there is provided an electronic apparatus comprising a display unit including a semiconductor device defined above, a housing provided with the display unit, and a communication unit provided in the housing and configured to perform external communication.

Further features of the present invention will become apparent from the following description of exemplary embodiments with reference to the attached drawings.

BRIEF DESCRIPTION OF THE DRAWINGS

FIGS. 4A and 4B are schematic sectional views of the junction region in an ACF compression-bonding step in the semiconductor device according to the embodiment;

DESCRIPTION OF THE EMBODIMENTS

Figure 1A:
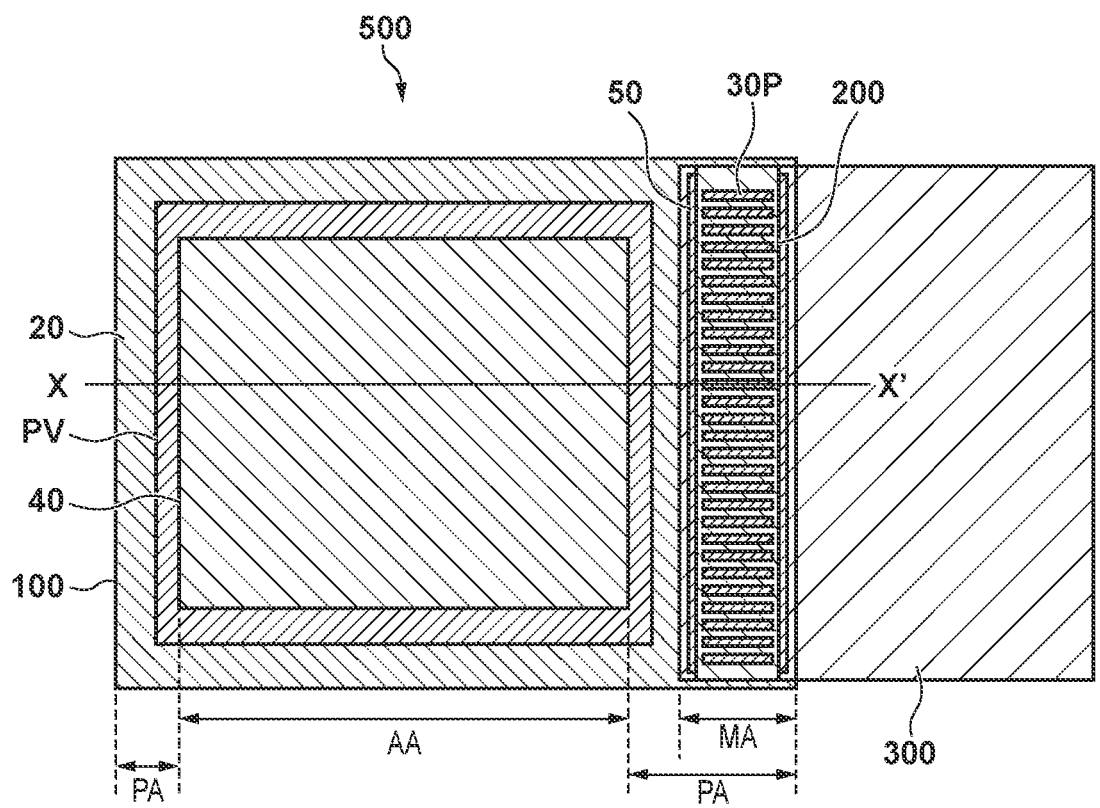
FIGS. 1A and 1B are schematic views for explaining a semiconductor device according to an embodiment of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 1B:
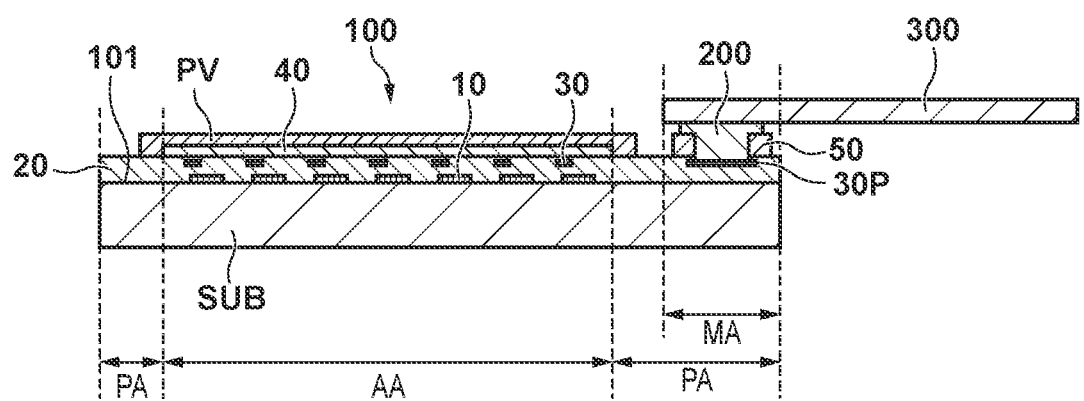

FIG. 1A is a plan view of a semiconductor device according to an embodiment of the present invention, and FIG. 1B is a sectional view taken along a line X-X' in FIG. 1A.

As shown in FIG. 1A, a semiconductor device 500 includes an element substrate 100, a wiring board 300, and an anisotropic conductive film 200. The element substrate 100 includes an effective region AA where a functional element 40 is provided on the main surface of the element substrate 100, and a peripheral region PA located in the periphery of the effective region AA. In the peripheral region PA, a junction region MA with the wiring board 300 is provided, and the anisotropic conductive film 200 is provided in the junction region MA. The peripheral region PA can include a non-effective pixel region (not shown) where non-effective pixels are provided. The non-effective pixel is a dummy pixel, a reference pixel, a test pixel, or the like that does not function as an effective pixel.

As shown in FIG. 1B, the element substrate 100 includes a substrate SUB, and among the upper and lower surfaces of the element substrate 100, the surface on which transistors 10 are provided is set as a main surface 101. The transistors 10 are provided on the substrate SUB, and an insulating layer 20 is provided on the transistors 10. In the insulating layer 20, a wiring layer 30 and terminals 30P are provided. An opening is formed in the insulating layer 20 on the plurality of arranged terminals 30P, and the external connection terminals 30P are exposed to the outside. The functional element 40 is provided on the insulating layer 20 in the effective region AA of the element substrate 100. The functional element 40 is a display element when the semiconductor device 500 serves as a display device. The display element is an EL element in an ELD (Electroluminescence Display) or a reflection element in a DMD (Digital Mirror Device). The functional element 40 is a photoelectric conversion element when the semiconductor device 500 serves as an image sensor.

A passivation layer PV for suppressing diffusion of water to the functional element 40 is provided on the functional element 40. An inter-terminal insulating portion 50 is provided between the terminals 30P on the insulating layer 20 in the junction region MA. The above-described passivation layer PV can be formed to the junction region MA, and used as the inter-terminal insulating portion 50. On the terminals 30P and the inter-terminal insulating portions 50, the anisotropic conductive film (ACF) 200 containing conductive particles 220 (see FIGS. 2A and 2B) is provided, and the wiring board 300 is joined (to be referred to as ACF compression-bonded hereinafter) via the anisotropic conductive film 200. Although not shown, if the functional element 40 serves as a display element, a lens layer can be provided on the functional element 40 to efficiently extract light emitted from the display element. Alternatively, if the functional element 40 serves as an organic EL element that emits white light, a color filter layer can additionally be provided on the functional element 40. The inter-terminal insulating portions 50 may be formed in the same layer as the above-described lens layer and color filter layer. A structure in which a transparent substrate made of glass or the like is bonded onto the functional element 40 by an adhesive without providing the passivation layer PV may be adopted.

Figure 2A:
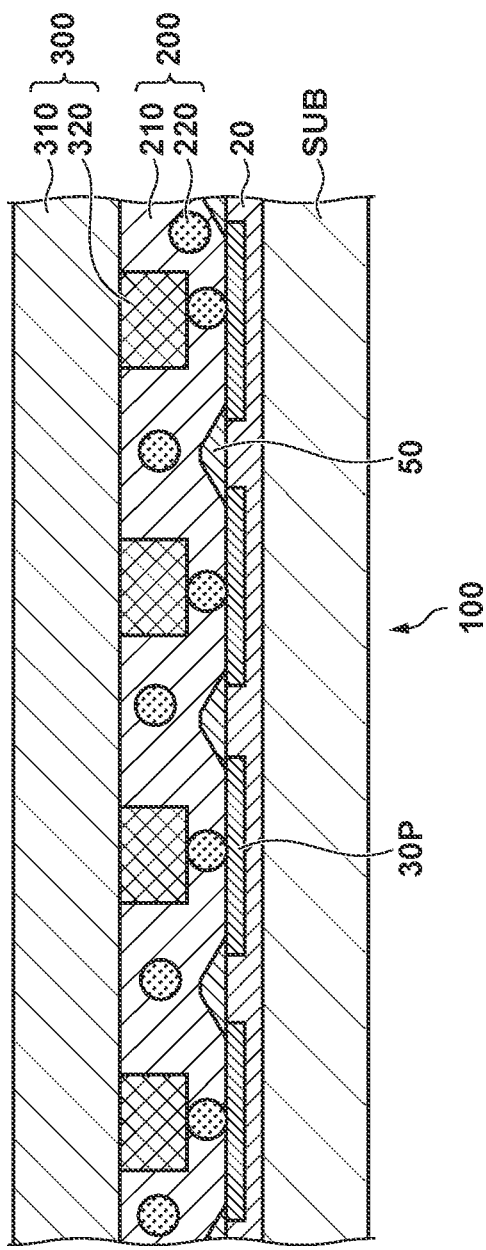
FIGS. 2A and 2B are schematic sectional views of a junction region in the semiconductor device according to the embodiment.
Figure 2B:
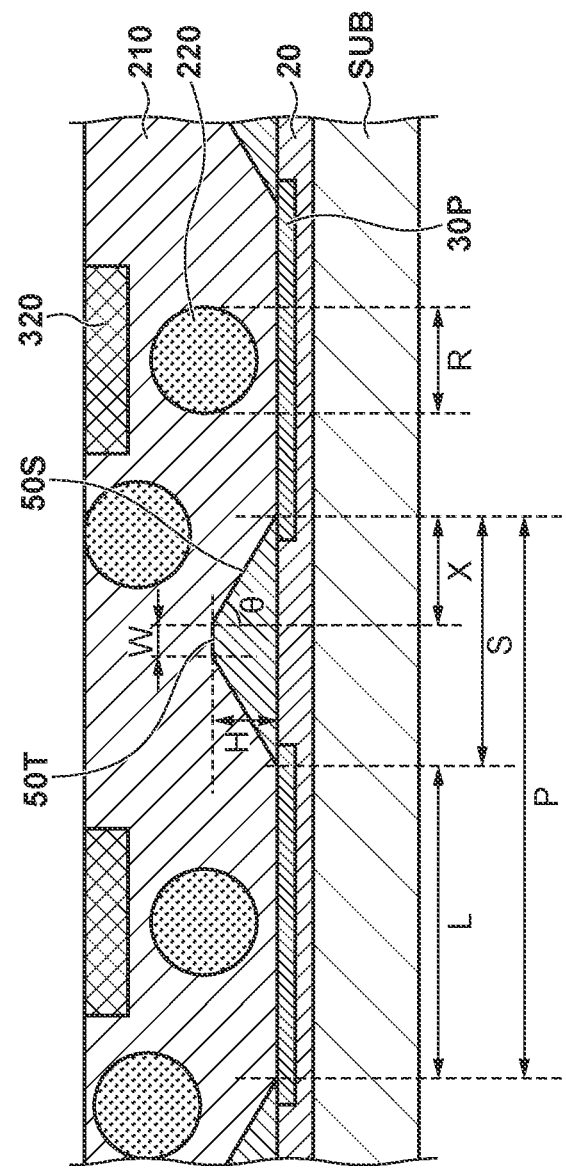

FIG. 2A is a schematic sectional view obtained by enlarging only the junction region MA of the semiconductor device according to this embodiment. FIG. 2B is a schematic sectional view showing a shape immediately before ACF compression-bonding.

As shown in FIG. 2A, the insulating layer 20 is provided on the substrate SUB, and the terminals 30P are provided in the insulating layer 20. The inter-terminal insulating portion 50 is provided between the terminals 30P to cover the insulating layer 20 and the outer end portion of each terminal 30P. By forming a high moisture proof inorganic film (low water permeability inorganic film) as the inter-terminal insulating portion 50 on the insulating layer 20 between the terminals, it is possible to suppress deterioration of the functional element 40 such as an organic EL display element or a semiconductor element caused by water. Alternatively, by forming, as the inter-terminal insulating portion 50, a resin film having a low elastic modulus on the insulating layer 20 between the terminals, it is possible to suppress damage to the insulating layer 20 by the conductive particles 220 contained in the anisotropic conductive film 200 at the time of ACF compression-bonding. The anisotropic conductive film 200 is formed by dispersedly containing the conductive particles 220 in a resin portion 210. The wiring board 300 is formed by a base material 310 and electrodes 320. The terminal 30P of the element substrate 100 and the electrode 320 of the wiring board 300 face each other in a one-to-one correspondence, and are electrically joined via the conductive particle 220.

Next, the shape of the inter-terminal insulating portion 50 as a characteristic portion of this embodiment will be described with reference to FIG. 2B. Note that FIG. 2B is a sectional view immediately before ACF bonding of the wiring board 300. As shown in FIG. 2B, the inter-terminal insulating portion 50 has a trapezoidal section including an upper surface 50T and inclined side surface portions 50S.

In this example, in a section when cutting the inter-terminal insulating portion 50 in a direction in which the plurality of terminals 30P are arrayed, W represents the width of the upper surface (top) 50T of the inter-terminal insulating portion 50, S represents the width of the bottom of the inter-terminal insulating portion 50 contacting the insulating layer 20 and the outer end portions of the terminals 30P, X represents the width of the inclined side surface portion (lateral side), and H represents a height from the surface of the terminal 30P to the upper surface 50T of the inter-terminal insulating portion 50. Furthermore, θ represents an angle formed by the normal of the upper surface 50T and the inclined side surface portion 50S. In addition, L represents the width of the terminal 30P exposed from the inter-terminal insulating portion 50 and R represents the diameter of the conductive particle 220.

A terminal-to-terminal pitch P as the distance between the adjacent terminals can be given by L+S. The terminal-to-terminal pitch P is, for example, 30 μm or less. The height H from the surface of the terminal 30P to the upper surface 50T of the inter-terminal insulating portion 50 is preferably smaller than the diameter R of the conductive particle 220. In the case in which the height H is larger than the diameter R of the conductive particle 220, if thermocompression bonding is performed in a state in which part of the electrode 320 of the wiring board 300 is superimposed (overlaid) on the inter-terminal insulating portion 50 due to an alignment deviation, when the electrode 320 connects against the upper surface 50T of the inter-terminal insulating portion 50, the electrode cannot move downward any more. Therefore, the electrode 320 does not connect against the conductive particle 220 on the terminal 30P, thereby causing a conduction failure. Even if part of the electrode 320 of the wiring board 300 is superimposed on the inter-terminal insulating portion 50 due to an alignment deviation, it is possible to obtain stable electric conduction by making the height H from the surface of the terminal 30P to the upper surface 50T of the inter-terminal insulating portion 50 smaller than the diameter R of the conductive particle.

Furthermore, the inter-terminal insulating portion 50 according to this embodiment has as its feature that the width W of the upper surface 50T is smaller than the diameter R of the electrode 320. The effect obtained by making the width W of the upper surface 50T of the inter-terminal insulating portion 50 smaller than the diameter R of the conductive particle 220 will be described later.

The width L of the terminal 30P exposed from the inter-terminal insulating portion 50 is, for example, 16 μm. The width S of the bottom of the inter-terminal insulating portion 50 is, for example, 6 μm, and thus the terminal-to-terminal pitch P is 22 μm. Assuming that the diameter R of the conductive particle 220 is, for example, 4 μm, the width W of the upper surface 50T of the inter-terminal insulating portion 50 is made smaller than 4 μm, and is, for example, 3 μm. As already described above, the height H from the surface of the terminal 30P to the upper surface 50T of the inter-terminal insulating portion 50 is also preferably made smaller than the diameter R of the conductive particle 220, and is, for example, 2 μm. Furthermore, the angle θ formed by the normal of the upper surface 50T of the inter-terminal insulating portion 50 and the inclined side surface portion 50S is, for example, 60°.

Figure 3A:
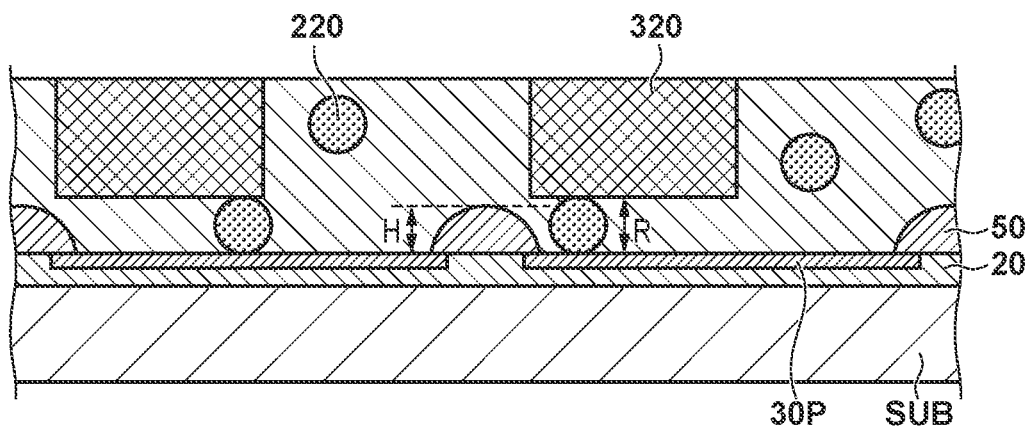
FIGS. 3A to 3C are schematic sectional views of the junction region in the semiconductor device according to the embodiment.
Figure 3B:
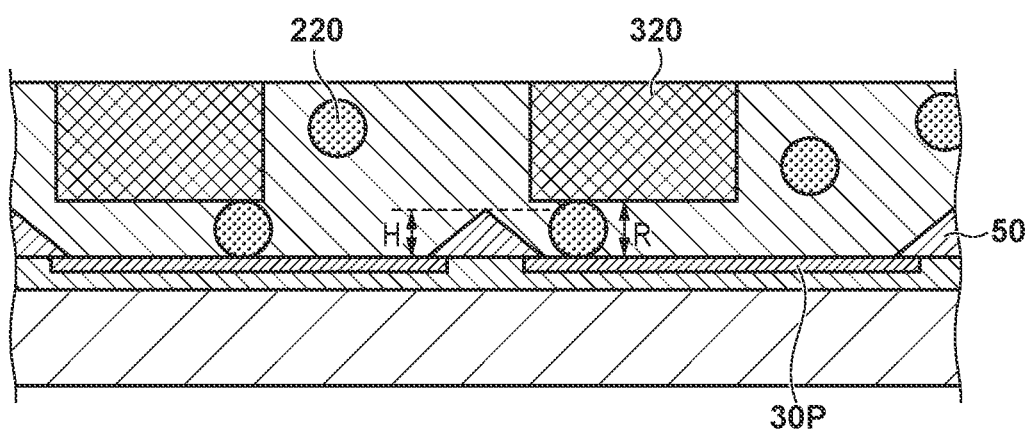
Figure 3C:
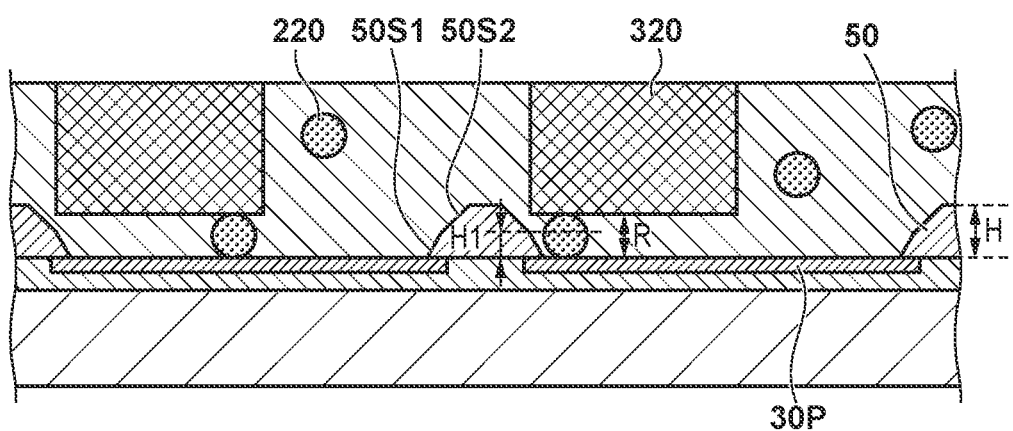

As long as the width W of the upper surface 50T of the inter-terminal insulating portion 50 is smaller than the diameter R of the conductive particle 220, the inter-terminal insulating portion 50 may be a semicircular shape shown in FIG. 3A or a triangular shape shown in FIG. 3B instead of an almost trapezoidal shape shown in FIG. 2B. As shown in FIG. 3C, the inter-terminal insulating portion 50 may have a polygonal shape including a plurality of inclined side surface portions (50S1 and 50S2).

Even in the case of the semicircular shape shown in FIG. 3A, the height H from the surface of the terminal 30P to the upper surface 50T of the inter-terminal insulating portion 50 is preferably smaller than the diameter R of the conductive particle 220. In the cases of the semicircular shape shown in FIG. 3A and the triangular shape shown in FIG. 3B, the width W of the upper surface of the inter-terminal insulating portion 50 becomes almost 0, and satisfies a relationship of W<R in this embodiment. The inter-terminal insulating portion 50 may have an elliptic shape, and the width of the top of the ellipse is made smaller than R.

In the case of the polygonal shape including the plurality of inclined portions, as shown in FIG. 3C, reference numeral 50S1 denotes the inclined portion contacting the terminal 30P; and 50S2, the inclined portion connected to the inclined portion 50S1. In this case, a height H1 from the surface of the terminal 30P to the connecting point between the inclined portions 50S1 and 50S2 is preferably made smaller than the diameter R of the conductive particle 220. Even in the case of the polygonal shape including the plurality of inclined portions, the height H from the surface of the terminal 30P to the upper surface of the inter-terminal insulating portion 50 is more preferably made smaller than the diameter R of the conductive particle 220. At least the height H1 from the surface of the terminal 30P to the connecting point between the inclined portions 50S1 and 50S2 is made smaller than the diameter R of the conductive particle 220. This suppresses contact of the electrode 320 with the inclined portion 50S1 even if part of the electrode 320 of the wiring board 300 is superimposed on the inclined portion 50S1 of the inter-terminal insulating portion 50 due to an alignment deviation, thereby obtaining stable conduction. If the diameter R of the conductive particle 220 is, for example, 4 μm, the height H1 from the surface of the terminal 30P to the connecting point between the inclined portions 50S1 and 50S2 is, for example, 3 μm. The inter-terminal insulating portion 50 may have an asymmetric, almost trapezoidal shape or triangular shape in which the left and right inclined side surface portions 50S have different inclinations.

As shown in FIG. 4A or 4B, in the junction region MA, the shapes of the inter-terminal insulating portions 50 can be made different (the inter-terminal insulating portions 50 can have a plurality of kinds of shapes). FIG. 4A is a schematic sectional view of a region between the terminals located near the center of the junction region MA, and FIG. 4B is a schematic sectional view of a region between the terminals near the end portion of the junction region MA. The inter-terminal insulating portion 50 has an isosceles trapezoidal shape shown in FIG. 4A near the center of the junction region MA. On the other hand, the inter-terminal insulating portion 50 is bilaterally asymmetric, as shown in FIG. 4B, near the end portion of the junction region MA. More specifically, the inter-terminal insulating portion 50 has an asymmetric trapezoidal shape in which a width Xc of an inclined side surface portion 50SC on the side of the central portion of the junction region MA is larger than a width Xe of an inclined side surface portion 50SE on the side of the end portion of the junction region MA.

Since in an ACF bonding step, the wiring board 300 and the element substrate 100 thermally expand from the central portion of the junction region MA to its end portion, the amount of thermal expansion of the wiring board 300 is larger in the end portion of the junction region MA than in the central portion of the junction region MA. Since the amount of thermal expansion of the wiring board 300 is small near the center of the junction region MA, the electrode 320 of the wiring board 300 is located at the center of the terminal 30P, as shown in FIG. 4A. To the contrary, since the amount of thermal expansion of the wiring board 300 is large near the end portion of the junction region MA, the electrode 320 of the wiring board 300 deviates from the center of the terminal 30P to be superimposed on the inter-terminal insulating portion 50, as shown in FIG. 4B. Therefore, with respect to the shape of the inter-terminal insulating portion 50 near the end portion of the junction region MA, the width Xc of the inclined side surface portion 50SC on the side of the central portion of the junction region MA is made larger than the width Xe of the inclined side surface portion 50SE on the side of the end portion of the junction region MA. This can make an attempt to reduce a conduction failure with respect to an alignment deviation caused by thermal expansion of the wiring board 300. If the shape of the inter-terminal insulating portion 50 is a semicircular shape, an elliptic shape, or an asymmetric trapezoidal shape, it is possible to use an etch back method, as will be described later.

Figure 5A:
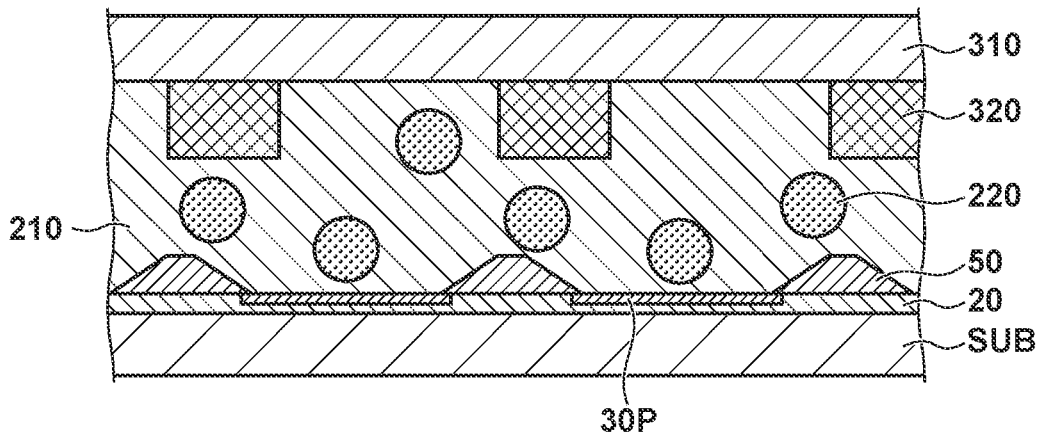
FIGS. 5A to 5C are schematic sectional views of the junction region of an organic EL display device according to the embodiment.
Figure 5B:
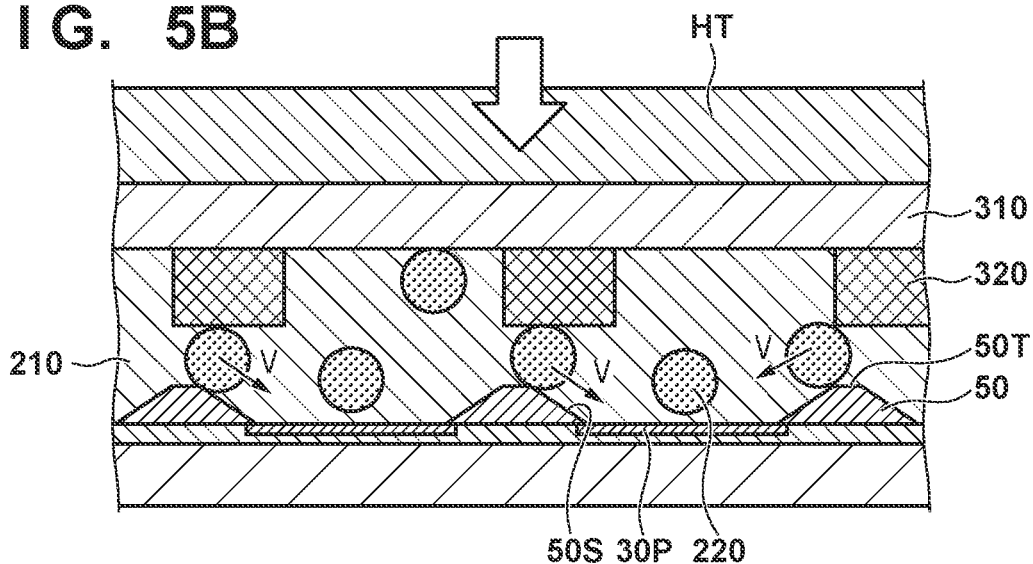
Figure 5C:
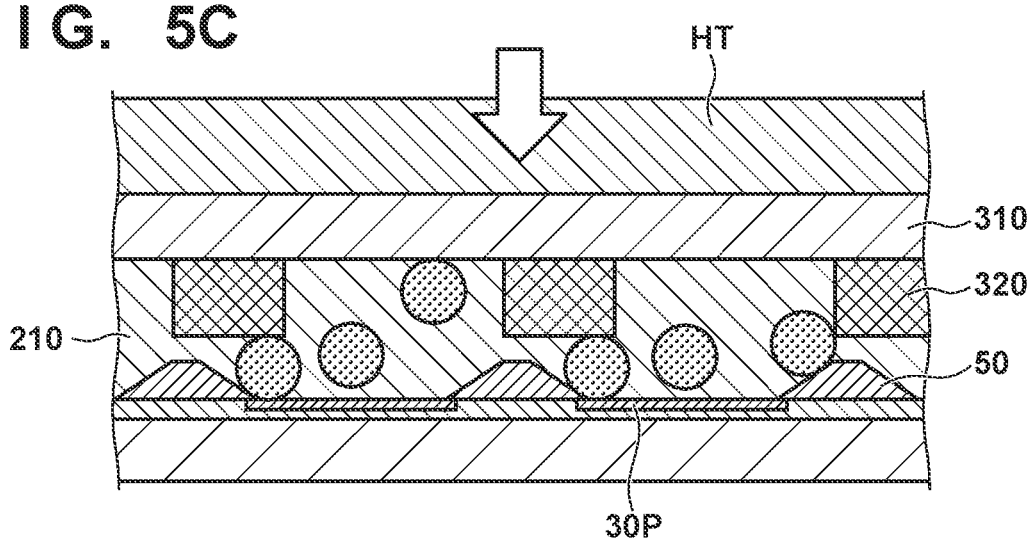

The effect obtained by making the width W of the upper surface of the inter-terminal insulating portion 50 smaller than the diameter R of the conductive particle will be described next with reference to FIGS. 5A to 5C. FIGS. 5A to 5C are schematic sectional views showing, in time series, the section of the junction region in a step of ACF-bonding the wiring board 300 to the element substrate 100. FIGS. 5A to 5C show a so-called alignment deviation state in which the electrode 320 of the wiring board 300 is superimposed on the inter-terminal insulating portion 50.

FIG. 5A shows a state in which the element substrate 100 and the wiring board 300 are temporarily bonded via the anisotropic conductive film 200, that is, a so-called temporary compression-bonded state. In temporary compression-bonding, compression-bonding is normally performed at a temperature as low as about 60 to 90° C. In this state, a gap between the terminal 30P and the electrode 320 of the wiring board 300 is larger than the diameter R of the conductive particle 220, and thus the terminal 30P and the electrode 320 are not in a conductive state yet.

FIG. 5B shows a state in which a compression-bonding heater HT gradually moves downward in a state in which the compression-bonding heater HT connects against the base material 310 of the wiring board 300. When the resin portion 210 is applied with heat and a load via the base material 310 of the wiring board 300, the resin portion 210 is softened by heat and fluidized, and thus the conductive particles 220 are pressed by the electrodes 320 to move in the resin portion 210. FIG. 5B shows a vector V of a force applied to the conductive particle 220. The conductive particle 220 is pressed by the electrode 320 to move along the inclined side surface portion 50S of the inter-terminal insulating portion 50, finally contacts the terminal 30P, as shown in FIG. 5C, and then contacts both the terminal 30P and the electrode 320. The resin portion 210 is completely hardened by heat from the compression-bonding heater HT while holding the state, and the state in which the conductive particle 220 contacts both the terminal 30P and the electrode 320 is fixed.

As the width W of the upper surface 50T of the inter-terminal insulating portion 50 increases, the conductive particle 220 is captured more easily between the electrode 320 and the upper surface 50T of the inter-terminal insulating portion 50. When the conductive particle 220 is sandwiched between the electrode 320 and the upper surface 50T of the inter-terminal insulating portion 50, the gap between the terminal 30P and the electrode 320 becomes larger than the diameter R of the conductive particle 220. Thus, the conductive particle 220 cannot contact both the terminal 30P and the electrode 320, thereby causing a conduction failure. The width W of the upper surface 50T of the inter-terminal insulating portion 50 is preferably smaller than the diameter R of the conductive particle 220, and is more preferably ½ of the diameter R of the conductive particle 220 or less. By making the width W of the upper surface 50T of the inter-terminal insulating portion 50 smaller than the diameter R of the conductive particle, it is possible to reduce the probability that the conductive particle 220 is captured by the upper surface 50T of the inter-terminal insulating portion 50, thereby reducing a conduction failure.

Furthermore, the angle θ formed by the normal of the upper surface 50T of the inter-terminal insulating portion 50 and the inclined portion preferably falls within the range of 30° (inclusive) to 70° (inclusive). If the angle θ is smaller than 30°, the width of the inclined side surface portion 50S of the inter-terminal insulating portion 50 is small, and the effect of this embodiment also becomes small. To the contrary, if the angle θ is larger than 70°, the conductive particle 220 is difficult to move along the inclined side surface portion 50S of the inter-terminal insulating portion 50, and thus the effect of this embodiment becomes small. In addition, the width of the inclined side surface portion 50S becomes large, thereby increasing the terminal-to-terminal pitch. Thus, the angle θ preferably falls within the range of 30° (inclusive) to 70° (inclusive). As described above, according to this embodiment, even if an alignment deviation occurs between the element substrate 100 and the wiring board 300, it is possible to reduce a conduction failure between the element substrate and the circuit board.

Figure 6:
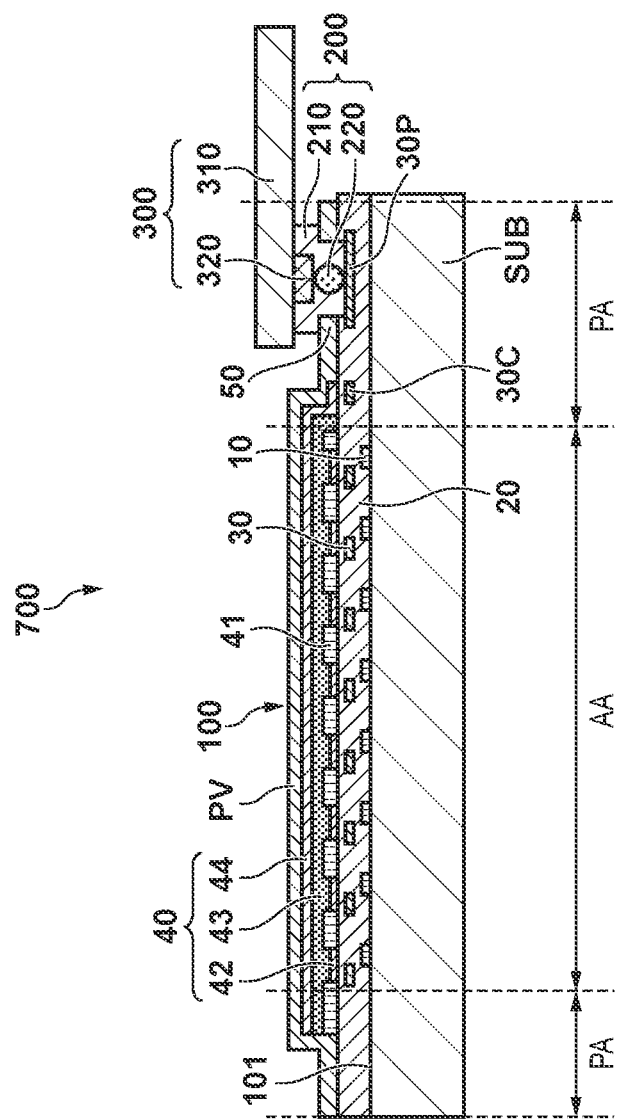
FIG. 6 is a view for explaining a method of manufacturing an organic EL display device.

A method of manufacturing an organic EL display device 700 as an example of the semiconductor device of this embodiment will be described with reference to FIG. 6. As shown in FIG. 6, the organic EL display device 700 includes the substrate SUB.

For the substrate SUB, for example, silicon can be used. Semiconductor elements 10 such as transistors are provided on the main surface 101 as the upper surface of the substrate SUB. The insulating layer 20 is provided on the main surface 101 of the substrate SUB and the semiconductor elements 10. For the insulating layer 20, silicon oxide, silicon nitride, silicon carbide, or the like is used. In the insulating layer 20, contact plugs (not shown) electrically connected to the semiconductor elements 10 are arranged. In each contact plug, a conductive member such as tungsten is embedded. In the insulating layer 20, the wiring layer 30 electrically connected to the semiconductor elements 10 via the contact plugs is provided. For the wiring layer 30, a metal member such as aluminum or copper may be used, and a barrier metal such as Ti, Ta, TiN, or TaN may be provided in the interface between the insulating layer and the wiring structure to suppress metal diffusion to the insulating layer.

The terminals 30P and a ground wiring line 30C for connection to an external power supply in the same layer as the wiring layer 30 are provided in the peripheral region PA of the element substrate 100 but the insulating layer 20 is removed on the terminals 30P to expose the surfaces of the terminals. As will be described later, a portion above the ground wiring line 30C is also open to be connected to a counter electrode 44 forming the organic EL element.

The organic EL element 40 is provided on the insulating layer 20 in the effective region AA. The organic EL element 40 includes at least pixel electrodes 42, an organic light emitting layer 43, and the counter electrode 44 that are electrically connected to the wiring layer 30 via through holes. The pixel electrodes 42 are separately arranged for respective pixels by separation portions 41 provided on the insulating layer 20. By covering the end portions of the pixel electrodes 42 with the separation portions 41, it is possible to suppress a short circuit between each pixel electrode 42 and the counter electrode 44. To readily inject and transport holes from the pixel electrode 42, a hole injection layer and a hole transport layer are preferably formed between the pixel electrodes 42 and the organic light emitting layer. Furthermore, to readily inject and transport electrons from the counter electrode 44, an electron transport layer and an electron injection layer are preferably formed between the counter electrode 44 and the organic light emitting layer. In this example, a stacked structure of the pixel electrodes 42/hole injection layer/hole transport layer/organic light emitting layer/electron transport layer/electron injection layer/counter electrode 44 is adopted.

The counter electrode 44 is an electrode common to all the pixels, and is extended to the peripheral region PA to be connected to the above-described ground wiring line 30C. The connecting portion between the ground wiring line 30C and the counter electrode 44 is generally called a cathode contact. The organic light emitting layer 43 and the counter electrode 44 are formed on the entire effective pixel region by vapor deposition or sputtering using a metal mask. However, since a gap is generated between the metal mask and the substrate, spreading occurs outside the metal mask opening. Since the spread of the organic light emitting layer is 0.2 mm or more, the position of the cathode contact is preferably provided on the outside of the end portion of the effective pixel region by at least 0.2 mm or more.

After that, the passivation layer PV for suppressing permeation of water into the organic EL element 40 is formed on the entire main surface 101 of the substrate SUB. An inorganic insulating film of silicon nitride, silicon oxynitride, or aluminum oxide can be used as the passivation layer PV. In this embodiment, silicon nitride of 2 μm is formed as the passivation layer PV. Next, the passivation layer PV formed on the terminals 30P is etched and removed using a photolithography step, thereby exposing the terminals 30P. That is, in this embodiment, the passivation layer PV (sealing film) for protecting the organic EL element 40 from water is shared with the inter-terminal insulating portions 50. The inter-terminal insulating portions 50 can be formed without adding a step by continuously forming the passivation layer PV and the inter-terminal insulating portions 50 in the same layer.

As described above, the inter-terminal insulating portion 50 includes the upper surface 50T and the inclined side surface portions 50S. As a method of forming the inclined side surface portions 50S of the inter-terminal insulating portion 50, an arbitrary etching method such as chemical dry etching or wet etching using a chemical solution can be used. In this embodiment, silicon nitride as the inter-terminal insulating portion 50 is dry-etched using a $CH_2F_2/O_2/Ar$ gas to form the inclined side surface portions 50S. When the $O_2$ gas is added, the resist is retreated in the width direction during dry etching, thereby obtaining the side surface shape inclined by an arbitrary angle.

Figure 7A:
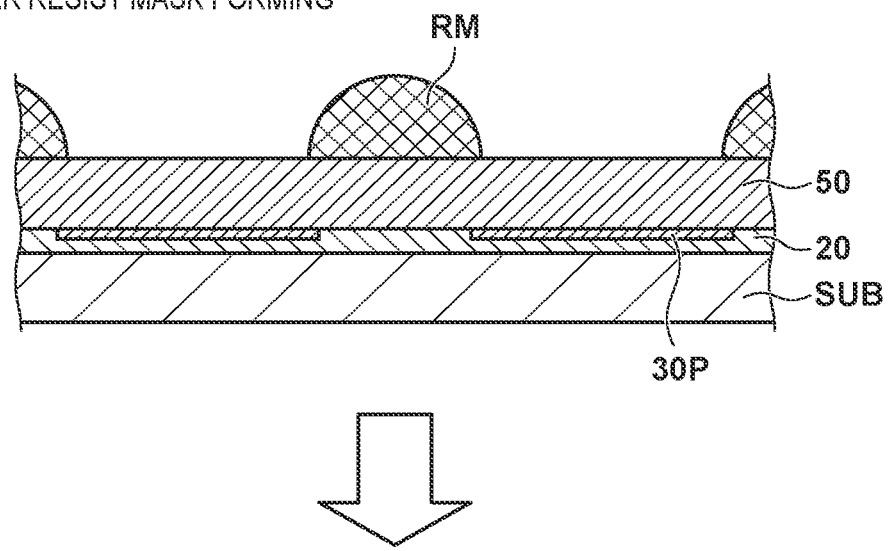
FIGS. 7A and 7B are schematic sectional views of the junction region when forming an insulating layer between terminals by an etch back method.
Figure 7B:
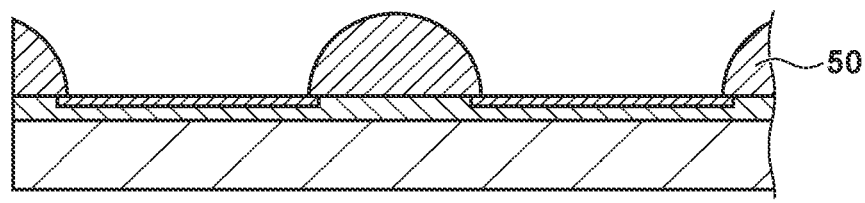

As shown in FIGS. 7A and 7B, the section shape of a resist mask RM is set to a semicircular shape, and the semicircular shape of the resist mask is transferred by a so-called etch back method of performing dry etching, thereby forming the inter-terminal insulating portion 50 in a semicircular shape. Even if the resist mask RM has an asymmetric trapezoidal shape or a polygonal shape including a plurality of inclined portions, the inter-terminal insulating portion 50 is similarly formed using the etch back method.

A lens structure (not shown) for improving the light extraction efficiency may additionally be provided on the above-described passivation layer PV, and the inter-terminal insulating portion 50 having a semicircular shape may be formed in the same step as that of the lens structure.

Next, an ACF bonding step of compression-bonding the wiring board 300 to the element substrate 100 via the anisotropic conductive film 200 is performed. In this embodiment, a flexible printed circuit (FPC) is used as the wiring board 300. An anisotropic conductive tape formed by dispersing the conductive particles 220 having a diameter of 4 μm in an epoxy resin is used as the anisotropic conductive film 200. The anisotropic conductive tape is bonded to the electrode surface of the FPC (300), and aligned using an image of a CCD camera or the like by alignment marks formed on the FPC (300) and the element substrate 100, and then the FPC (300) is temporarily compression-bonded to the element substrate 100. The temperature of temporary compression-bonding is 60° C. Next, actual compression-bonding is performed at 180° C. for 20 sec to completely harden the resin of the anisotropic conductive film 200, thereby completing ACF bonding.

The accuracy of alignment using an image is about 6 μm although it depends on a compression-bonding device. In addition to the accuracy of the image alignment, a deviation occurs due to the difference in the amount of thermal expansion between the element substrate 100 and the wiring board 300 at the time of actual compression-bonding. For the FPC as the wiring board 300, a polyimide resin is generally used as a base material, and a low expansion FPC having a thermal expansion coefficient close to that (3 to $4\times10^{-6}/°$ C.) of silicon of the element substrate 100 is commercially available.

If, for example, the thermal expansion amount for a base material width of 20 mm is calculated, even if a low expansion FPC in which the difference in the thermal expansion coefficient between silicon and polyimide is only $0.7\times10^{-6}/°$ C. is used, there is a difference of 2 μm in the thermal expansion amount. Furthermore, even if the thermal expansion coefficients of the element substrate 100 and the FPC (300) are equal to each other, the FPC directly contacting the compression-bonding heater and the element substrate indirectly contacting the compression-bonding heater have different temperatures, and thus a difference in the thermal expansion amount is generated due to the temperature difference between the element substrate and the FPC. Even if the thermal expansion coefficients of silicon and polyimide for a width of 20 mm are both $3.7\times10^{-6}/°$ C., if a temperature distribution in which the temperature of FPC (polyimide) is 200° C., the temperature of the anisotropic conductive film is 180° C., and the temperature of the element substrate (silicon) is 160° C. is generated, a difference of about 3 μm is generated in the thermal expansion amount for a base material width of 20 mm.

Therefore, in consideration of both the image alignment accuracy and the difference in the thermal expansion amount, a deviation of about 10 µm in total needs to be assumed. In this embodiment, the width L of the exposed terminal 30P=20 µm, and the inter-terminal insulating portion 50 has a trapezoidal shape in which the width W of the upper surface 50T=2 µm, the width S of the bottom=8 µm, the terminal-to-terminal pitch L+S=28 µm, and the width of each of the left and right inclined side surface portions 50S=3 µm.

The width of the electrode of the FPC is 8 µm. In this case, if the center of the terminal of the element substrate 100 and the center of the electrode of the FPC (300) deviate from each other on one side by 6 µm or more, the electrode of the FPC (300) is superimposed on the inter-terminal insulating portion 50.

If the center of the terminal 30P of the element substrate 100 and the center of the electrode 320 of the FPC deviate from each other on one side by 10 µm due to the image alignment accuracy and the difference in the thermal expansion amount, the electrode 320 of the FPC is superimposed on the inter-terminal insulating portion 50 by 4 µm. However, in this embodiment, the width of the inclined side surface portion 50S is 3 µm and thus the electrode 320 is superimposed on the upper surface of the inter-terminal insulating portion 50 by only 1 µm. Therefore, the probability that the conductive particle 220 having a diameter of 4 µm is captured between the electrode 320 and the upper surface 50T of the inter-terminal insulating portion 50 is very low. Furthermore, since the conductive particle 220 existing between the electrode 320 and the inclined side surface portion 50S having a width of 3 µm moves onto the terminal 30P along the inclined surface, a conduction failure is difficult to occur.

As described above, when the inter-terminal insulating portions 50 have the above arrangement, it is possible to reduce a conduction failure when the electrodes 320 of the wiring board 300 are compression-bonded while deviating with respect to the terminals 30P of the element substrate 100. In other words, it is unnecessary to widely design the terminals 30P in consideration of the margin of a deviation caused by the alignment accuracy or the difference in the thermal expansion amount, and it is possible to decrease the terminal width and the terminal-to-terminal pitch. As a result, the size of the semiconductor device can be reduced.

Comparative Example

An organic EL display device in which the width of the upper surface of an inter-terminal insulating portion 50 is large is manufactured, and compared with the above embodiment. A width L of an exposed terminal=20 µm, the inter-terminal insulating portion has a trapezoidal shape in which a width W of a top=7 µm, a width S of a bottom=8 µm, a terminal-to-terminal pitch L+S=28 µm, and the width of each of left and right inclined surfaces=0.5 µm, the electrode width of an FPC is 8 µm, and the diameter of a conductive particle is 4 µm. The structure and manufacturing method are the same as those of the organic EL display device of the above embodiment except for the shape of the inter-terminal insulating portion 50.

With respect to element substrates of the embodiment and the comparative example, the numbers of times of occurrence of a conduction failure are compared with each other by manufacturing 10 organic EL display devices by performing ACF-bonding by aligning the FPC with respect to the element substrate while intentionally deviating the FPC by 5 µm, 7 µm, or 9 µm. Table 1 shows the result.

TABLE 1

| | Deviation Amount | | |
|---|---|---|---|
| | 5 µm | 7 µm | 9 µm |
| Embodiment | 0 | 0 | 0 |
| Comparative Example | 0 | 4 | 10 |

As shown in Table 1, in the comparative example, a conduction failure occurs when the alignment deviation amount is 7 µm or more. On the other hand, in the arrangement of the above embodiment, no conduction failure occurs even when the alignment deviation amount is 9 µm. Therefore, it is confirmed that a conduction failure occurring when the alignment deviation amount between the wiring board 300 and the element substrate 100 is large is suppressed by using the arrangement of the above embodiment.

[Arrangement of Organic Light Emitting Element]

Next, an organic light emitting element to which the arrangement of this embodiment is applied will be described. The organic light emitting element is formed by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

[Substrate]

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed so that the wiring can be formed between the insulating layer and the first electrode and insulation from the unconnected wiring can be ensured. For example, a resin such as polyimide, silicon oxide, silicon nitride, or the like can be used.

[Electrode]

A pair of electrodes can be used as the electrodes. The pair of electrodes can be an anode and a cathode.

When an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode.

As the constituent material of the anode, a material having a work function as large as possible is preferably used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. When the anode is used as a transparent electrode, an oxide transparent conductive layer made of indium tin oxide (ITO), indium zinc oxide, or the like can be used, but the present invention is not limited thereto.

A photolithography technique can be used to form the electrode.

On the other hand, as the constituent material of the cathode, a material having a small work function is preferably used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among others, silver is preferably used. To suppress aggregation of silver, a silver alloy is more preferably used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited. The method of forming the cathode is not particularly limited, but direct current sputtering or alternating current sputtering is preferably used since the good film coverage is provided and the resistance is easily lowered.

[Organic Compound Layer]

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

[Protection Layer]

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 μm by a CVD method. The protection layer may be provided using an atomic deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

[Color Filter]

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

[Planarizing Layer]

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. However, a polymetric material is more preferable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

[Microlens]

The light emitting device can include an optical member such as a microlens on the light emission side. The microlens can be made of acrylic resin, epoxy resin, or the like. The microlens can aim to increase the amount of light extracted from the light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircular of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

[Counter Substrate]

A counter substrate can be provided on the planarizing layer. The counter substrate is called a counter substrate because it is provided at a position corresponding to the above-described substrate. The constituent material of the counter substrate can be the same as that of the above-described substrate. When the above-described substrate is the first substrate, the counter substrate can be the second substrate.

[Organic Layer]

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

[Pixel Circuit]

The light emitting device can include a pixel circuit connected to the light emitting element. The pixel circuit may be an active matrix circuit that individually controls light emission of the first and second light emitting elements. The active matrix circuit may be a voltage or current programming circuit. A driving circuit includes a pixel circuit for each pixel. The pixel circuit can include a light emitting element, a transistor for controlling light emission luminance of the light emitting element, a transistor for controlling a light emission timing, a capacitor for holding the gate voltage of the transistor for controlling the light emission luminance, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

In accordance with the size of the light emission region, the magnitude of a driving current can be decided. More specifically, when causing the first and the second light emitting elements to emit light with the same luminance, the current value flowing through the first light emitting element may be smaller than that flowing through the second light emitting element. This is because the light emission region is small and thus a necessary current may be small.

[Pixel]

The light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region.

The pixel opening can have a size of 5 µm (inclusive) to 15 µm (inclusive). More specifically, the pixel opening can have a size of 11 µm, 9.5 µm, 7.4 µm, 6.4 µm, or the like.

A distance between the sub-pixels can be 10 µm or less, and can be, more specifically, 8 µm, 7.4 µm, or 6.4 µm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

[Application of Organic Light Emitting Element of Embodiment of Present Invention]

The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

The display device according to the embodiment will be described next with reference to the accompanying drawings.

Figure 8A:
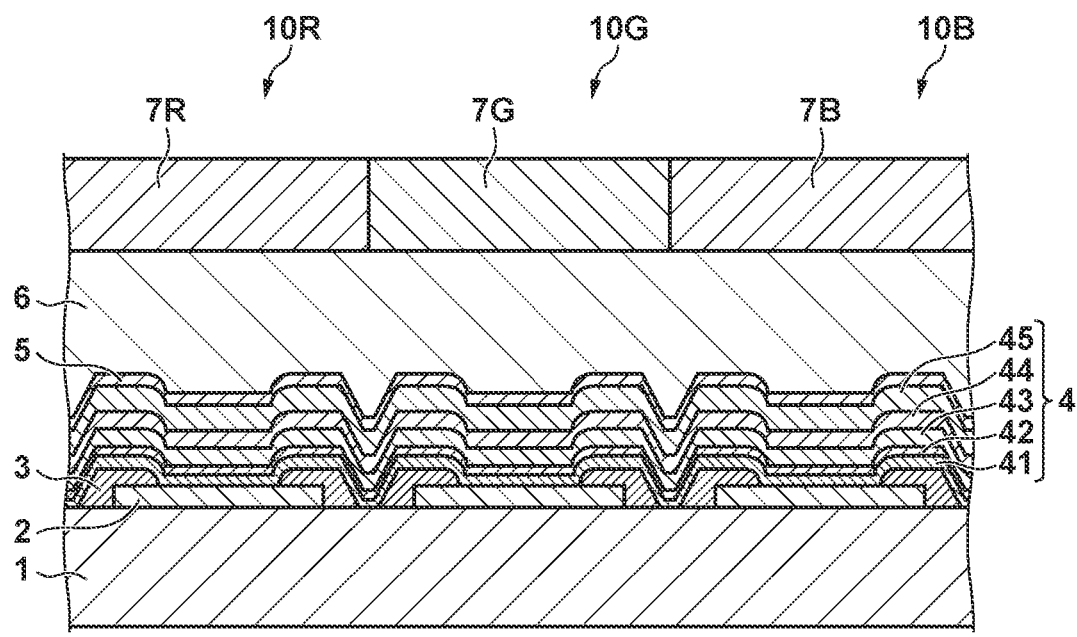
FIGS. 8A and 8B are schematic sectional views showing a pixel of a light emitting device according to an embodiment.
Figure 8B:
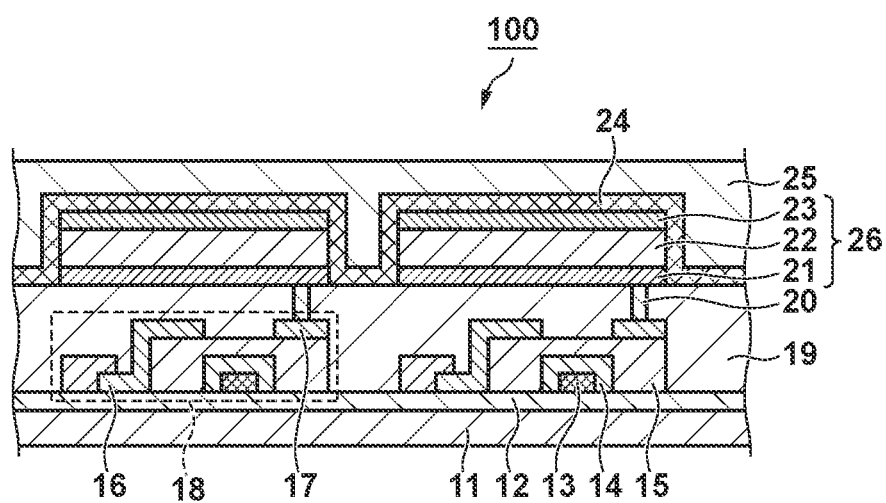

FIGS. 8A and 8B are schematic sectional views showing an example of the display device including the organic light emitting element and the transistor connected to it. The transistor is an example of an active element. The transistor may be a thin-film transistor (TFT).

FIG. 8A shows an example of a pixel as a constituent element of the display device according to this embodiment. The pixel includes sub-pixels 10. The sub-pixels are divided into sub-pixels 10R, 10G, and 10B by emitted light components. The light emission colors may be discriminated by wavelengths of light components emitted from the light emitting layers, or light emitted from each sub-pixel may be selectively transmitted or undergo color conversion by a color filter or the like. Each sub-pixel includes a reflective electrode 2 as the first electrode on an interlayer insulating layer 1, an insulating layer 3 covering the end of the reflective electrode 2, an organic compound layer 4 covering the first electrode and the insulating layer, a transparent electrode 5, a protection layer 6, and a color filter 7.

The interlayer insulating layer 1 can include a transistor and a capacitive element arranged in the interlayer insulating layer 1 or a layer below it.

The transistor and the first electrode can electrically be connected via a contact hole (not shown) or the like.

The insulating layer 3 is also called a bank or a pixel separation film. The insulating layer 3 covers the end of the first electrode, and is arranged to surround the first electrode. A portion where no insulating layer is arranged contacts the organic compound layer 4 to form a light emission region.

The organic compound layer 4 includes a hole injection layer 41, a hole transport layer 42, a first light emitting layer 43, a second light emitting layer 44, and an electron transport layer 45.

The second electrode 5 may be a transparent electrode, a reflective electrode, or a translucent electrode.

The protection layer 6 suppresses permeation of water into the organic compound layer. The protection layer is shown as a single layer but may include a plurality of layers. Each layer can be an inorganic compound layer or an organic compound layer.

The color filter 7 is divided into color filters 7R, 7G, and 7B by colors. The color filters can be formed on the planarizing layer (not shown). A resin protection layer (not shown) can be provided on the color filters. The color filters can be formed on the protection layer 6. Alternatively, the color filters can be provided on the counter substrate such as a glass substrate, and then the substrate may be bonded.

A display device 100 shown in FIG. 8B is provided with an organic light emitting element 26 and a TFT 18 as an example of a transistor. A substrate 11 of glass, silicon, or the like is provided and an insulating layer 12 is provided on the substrate 11. The active element 18 such as a TFT is arranged on the insulating layer, and a gate electrode 13, a gate insulating film 14, and a semiconductor layer 15 of the active element are arranged. The TFT 18 further includes the semiconductor layer 15, a drain electrode 16, and a source electrode 17. An insulating film 19 is provided on the TFT 18. The source electrode 17 and an anode 21 forming the organic light emitting element 26 are connected via a contact hole 20 formed in the insulating film.

Note that a method of electrically connecting the electrodes (anode and cathode) included in the organic light emitting element 26 and the electrodes (source electrode and drain electrode) included in the TFT is not limited to that shown in FIG. 8B. That is, one of the anode and cathode and one of the source electrode and drain electrode of the TFT are electrically connected. The TFT indicates a thin-film transistor.

In the display device 100 shown in FIG. 8B, an organic compound layer is illustrated as one layer. However, an organic compound layer 22 may include a plurality of layers. A first protection layer 24 and a second protection layer 25 are provided on a cathode 23 to suppress the degradation of the organic light emitting element.

A transistor is used as a switching element in the display device 100 shown in FIG. 8B but may be used as another switching element.

The transistor used in the display device 100 shown in FIG. 8B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the display device 100 shown in FIG. 8B may be formed in the substrate such as an Si substrate. Forming the transistor in the substrate means forming the transistor by processing the substrate such as an Si substrate. That is, when the transistor is included in the substrate, it can be considered that the substrate and the transistor are formed integrally.

The light emission luminance of the organic light emitting element according to this embodiment can be controlled by the TFT which is an example of a switching element, and the plurality of organic light emitting elements can be provided in planes to display an image with the light emission luminances of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element is preferably provided on the Si substrate.

Figure 9:
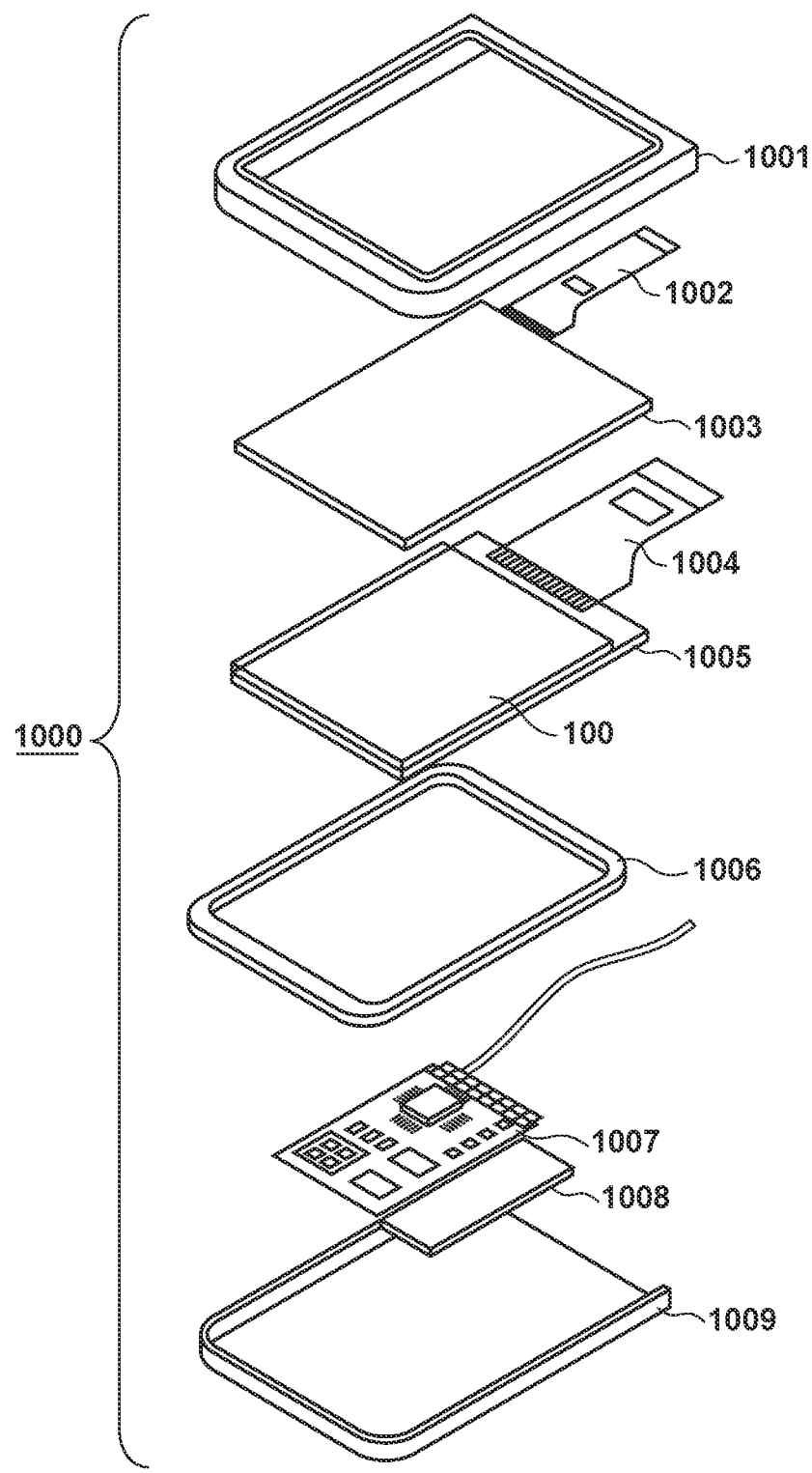
FIG. 9 is a schematic view showing a display device according to the embodiment.

FIG. 9 is a schematic view showing an example of the display device according to this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Transistors are printed on the circuit board 1007. The battery 1008 is unnecessary if the display device is not a portable apparatus. Even when the display device is a portable apparatus, the battery 1008 may be arranged at another position.

The display device according to this embodiment can include color filters of red, green, and blue. The color filters of red, green, and blue can be arranged in a delta array.

The display device according to this embodiment can also be used for a display unit of a portable terminal. At this time, the display unit can have both a display function and an operation function. Examples of the portable terminal are a portable phone such as a smartphone, a tablet, and a head mounted display.

The display device according to this embodiment can be used for a display unit of an image capturing device including an optical unit having a plurality of lenses, and an image sensor for receiving light having passed through the optical unit. The image capturing device can include a display unit for displaying information acquired by the image sensor. In addition, the display unit can be either a display unit exposed outside the image capturing device, or a display unit arranged in the finder. The image capturing device can be a digital camera or a digital video camera.

Figure 10A:
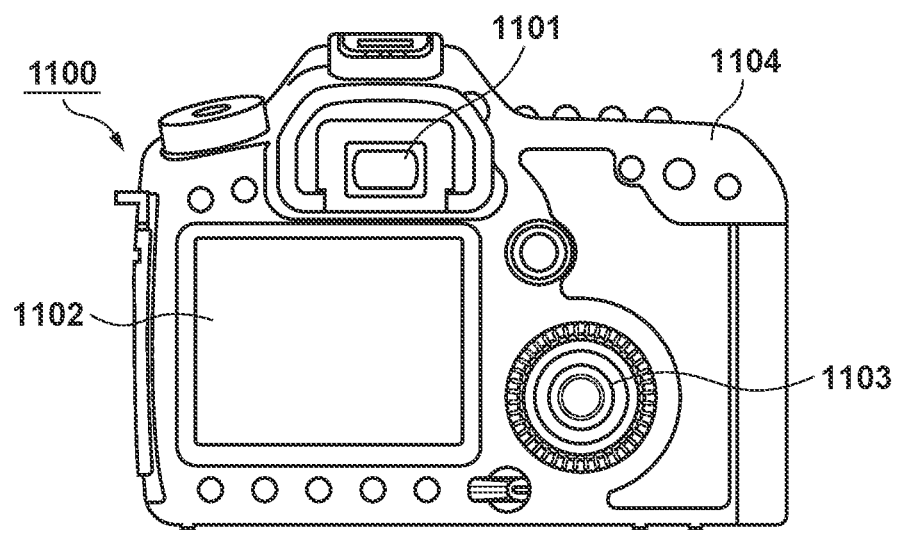
FIGS. 10A and 10B are schematic views respectively showing an image capturing device and an electronic apparatus according to the embodiment.

FIG. 10A is a schematic view showing an example of the image capturing device according to this embodiment. An image capturing device 1100 can include a viewfinder 1101, a rear display 1102, an operation unit 1103, and a housing 1104. The viewfinder 1101 can include the display device according to this embodiment. In this case, the display device can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time, so the information is preferably displayed as soon as possible. Therefore, the display device using the organic light emitting element of the present invention is preferably used. This is so because the organic light emitting element has a high response speed. The display device using the organic light emitting element can be used for the apparatuses that require a high display speed more preferably than for the liquid crystal display device.

The image capturing device 1100 includes an optical unit (not shown). This optical unit has a plurality of lenses, and forms an image on an image sensor that is accommodated in the housing 1104. The focal points of the plurality of lenses can be adjusted by adjusting the relative positions. This operation can also automatically be performed. The image capturing device may be called a photoelectric conversion device. Instead of sequentially capturing an image, the photoelectric conversion device can include, as an image capturing method, a method of detecting the difference from a previous image, a method of extracting an image from an always recorded image, or the like.

Figure 10B:
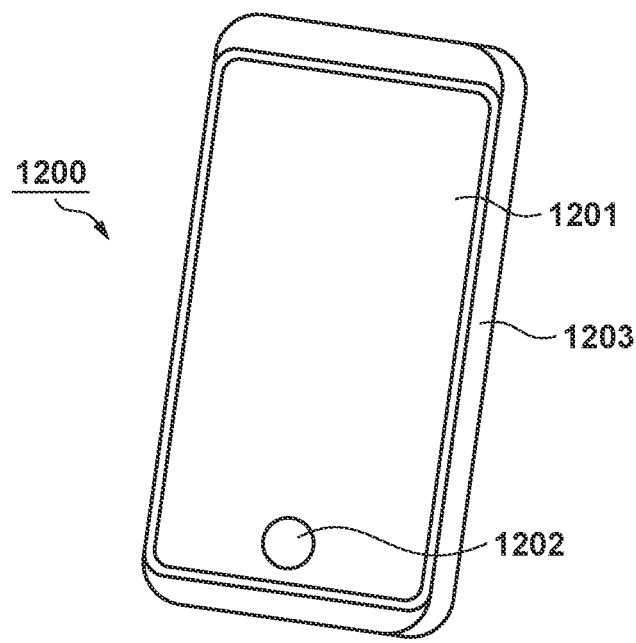

FIG. 10B is a schematic view showing an example of an electronic apparatus according to this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit can also be a biometric authentication unit that performs unlocking or the like by recognizing a fingerprint. The electronic apparatus including the communication unit can also be regarded as a communication apparatus. The electronic apparatus can further have a camera function by including a lens and an image sensor. An image captured by the camera function is displayed on the display unit. Examples of the electronic apparatus are a smartphone and a notebook computer.

Figure 11A:
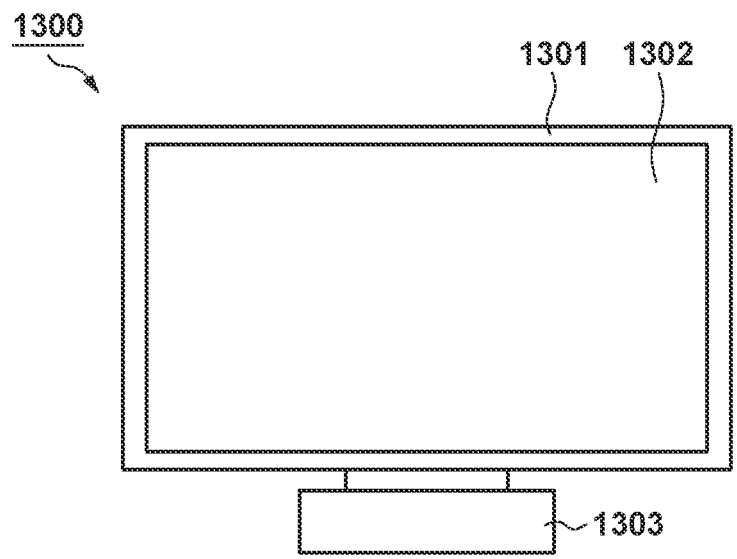
FIGS. 11A and 11B are schematic views each showing a display device according to the embodiment.
Figure 11B:
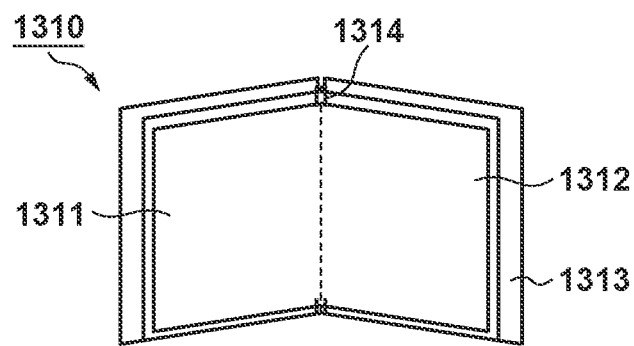

FIGS. 11A and 11B are schematic views showing examples of the display device according to this embodiment. FIG. 11A shows a display device such as a television monitor or a PC monitor. A display device 1300 includes a frame 1301 and a display unit 1302. The light emitting device according to this embodiment can be used for the display unit 1302.

The display device 1300 includes a base 1303 that supports the frame 1301 and the display unit 1302. The base 1303 is not limited to the form shown in FIG. 11A. The lower side of the frame 1301 may also function as the base.

In addition, the frame 1301 and the display unit 1302 can be bent. The radius of curvature in this case can be 5,000 (inclusive) mm to 6,000 (inclusive) mm.

FIG. 11B is a schematic view showing another example of the display device according to this embodiment. The display surface of a display device 1310 shown in FIG. 11B can be folded, that is, the display device 1310 is a so-called foldable display device. The display device 1310 includes a first display unit 1311, a second display unit 1312, a housing 1313, and a bending point 1314. Each of the first display unit 1311 and the second display unit 1312 can include the light emitting device according to this embodiment. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 12A:
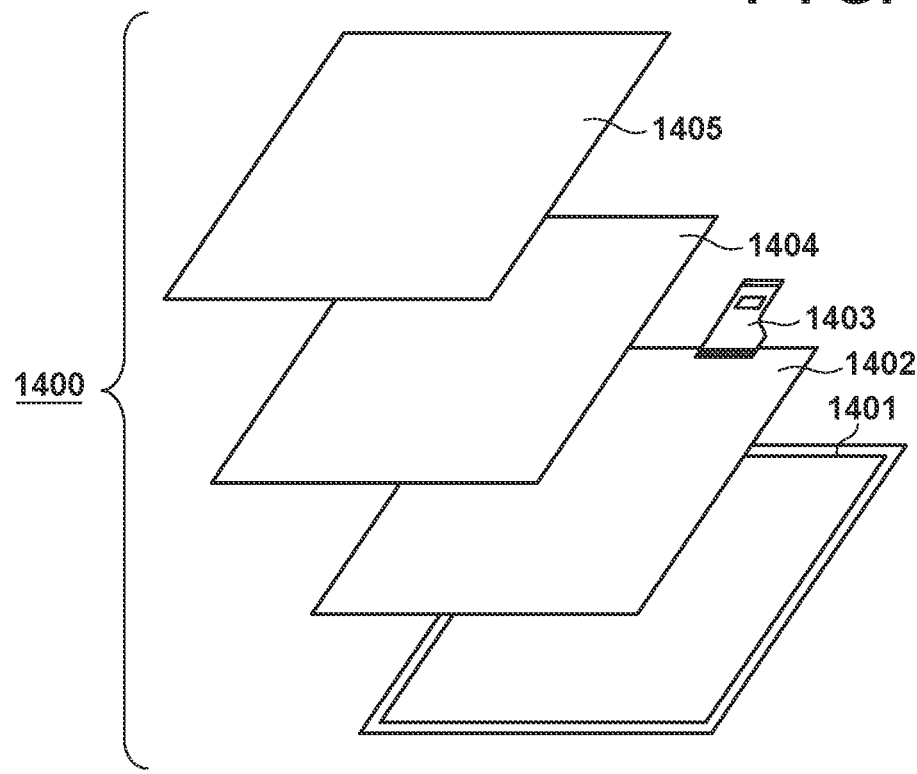
FIGS. 12A and 12B are schematic views respectively showing an illumination device and a moving body according to the embodiment.

FIG. 12A is a schematic view showing an example of the illumination device according to this embodiment. An illumination device 1400 can include a housing 1401, a light source 1402, a circuit board 1403, an optical film 1404, and a light-diffusing unit 1405. The light source can include the organic light emitting element according to this embodiment. The optical film can be a filter that improves the color rendering of the light source. When performing lighting-up or the like, the light-diffusing unit can throw the light of the light source over a broad range by effectively diffusing the light. The optical film and the light-diffusing unit can be provided on the illumination light emission side. The illumination device can also include a cover on the outermost portion, as needed.

The illumination device is, for example, a device for illuminating the interior of the room. The illumination device can emit white light, natural white light, or light of any color from blue to red. The illumination device can also include a light control circuit for controlling these light components.

The illumination device can also include the organic light emitting element according to the present invention and a power supply circuit connected to the organic light emitting element. The power supply circuit is a circuit for converting an AC voltage into a DC voltage. White has a color temperature of 4,200 K, and natural white has a color temperature of 5,000 K. The illumination device may also include a color filter.

In addition, the illumination device according to this embodiment can include a heat radiation unit. The heat radiation unit radiates the internal heat of the device to the outside of the device, and examples are a metal having a high specific heat and liquid silicon.

Figure 12B:
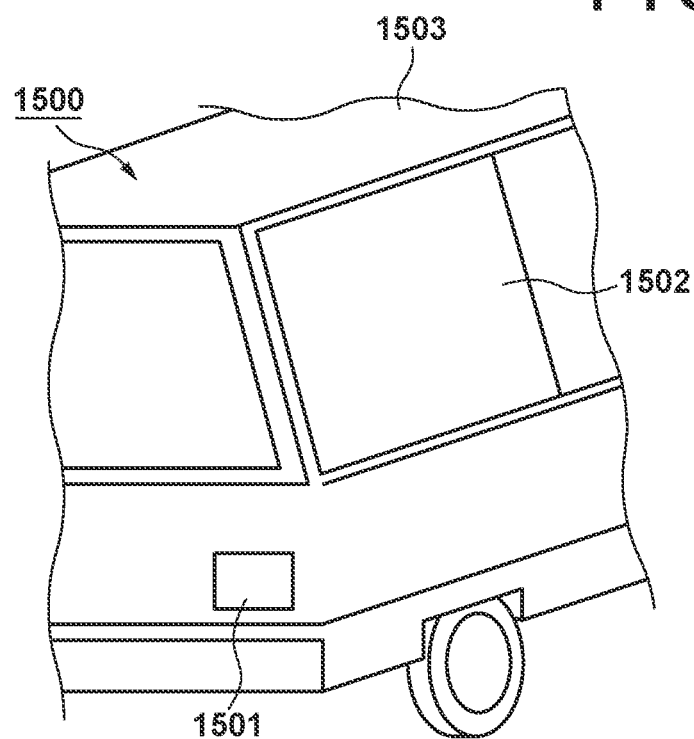

FIG. 12B is a schematic view of an automobile as an example of a moving body according to this embodiment. The automobile has a taillight as an example of the lighting appliance. An automobile 1500 has a taillight 1501, and can have a form in which the taillight is turned on when performing a braking operation or the like.

The taillight 1501 can include the organic light emitting element according to this embodiment. The taillight can include a protection member for protecting the organic EL element. The material of the protection member is not limited as long as the material is a transparent material with a strength that is high to some extent, and is preferably polycarbonate. A furandicarboxylic acid derivative, an acrylonitrile derivative, or the like may be mixed in polycarbonate.

The automobile 1500 can include a vehicle body 1503, and a window 1502 attached to the vehicle body 1503. This window can be a window for checking the front and back of the automobile, and can also be a transparent display. This transparent display can include the organic light emitting element according to this embodiment. In this case, the constituent materials of the electrodes and the like of the organic light emitting element are preferably formed by transparent members.

The moving body according to this embodiment can be a ship, an airplane, a drone, or the like. The moving body can include a main body and a lighting appliance installed in the main body. The lighting appliance can emit light for making a notification of the position of the main body. The lighting appliance includes the organic light emitting element according to this embodiment.

Figure 13A:
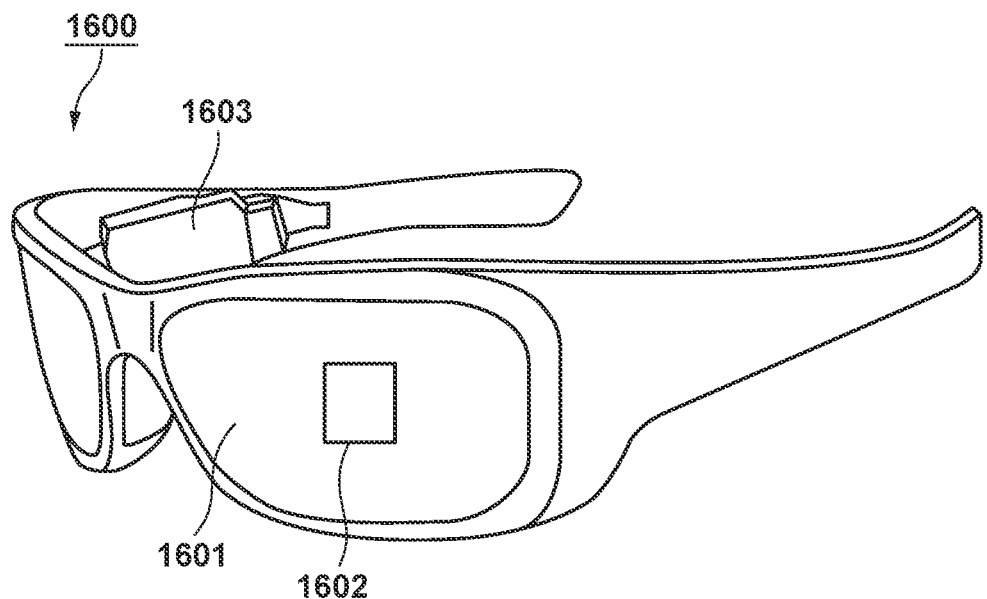
FIGS. 13A and 13B are schematic views each showing a wearable device according to the embodiment.
Figure 13B:
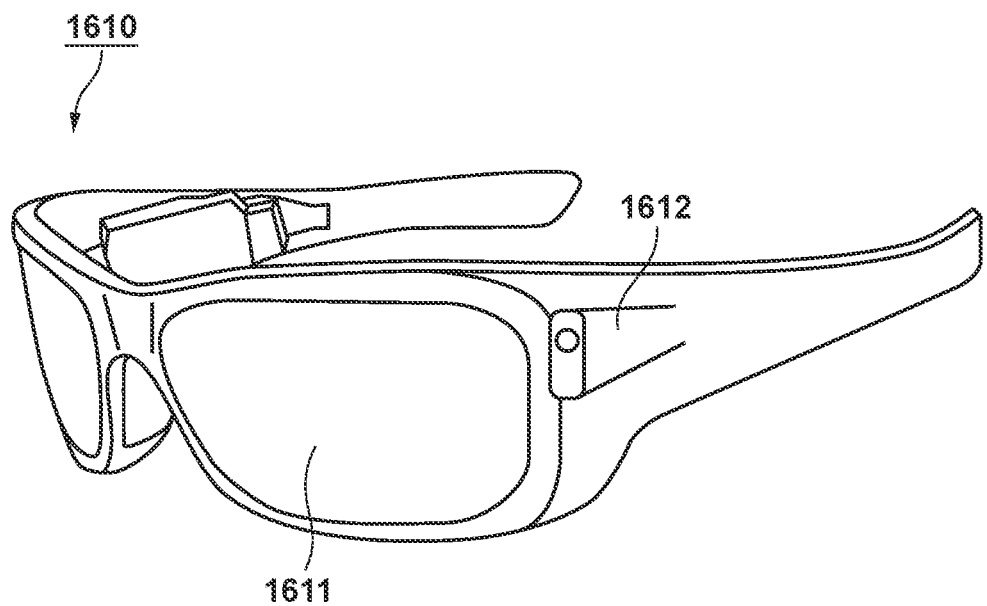

FIGS. 13A and 13B show examples of a wearable device to which a light emitting device according to an embodiment of the present invention is applied, and are schematic views of a glass-type display device. The display device can be applied to a system that can be worn as a wearable device such as smartglasses, an HMD (Head Mounted Display), or a smart contact lens. An image capturing display device used for such applications can include an image capturing device capable of photoelectrically converting visible light and a display device capable of emitting visible light.

Glasses 1600 (smartglasses) according to one application will be described with reference to FIG. 13A. An image capturing device 1602 such as a CMOS sensor or an SPAD is provided on the surface side of a lens 1601 of the glasses 1600. In addition, the display device of each of the above-described embodiments is provided on the back surface side of the lens 1601.

The glasses 1600 can further include a control device 1603. The control device 1603 functions as a power supply that supplies power to the image capturing device 1602 and the display device according to each embodiment. In addition, the control device 1603 controls the operations of the image capturing device 1602 and the display device. An optical system configured to condense light to the image capturing device 1602 is formed on the lens 1601.

Glasses 1610 (smartglasses) according to one application will be described with reference to FIG. 13B. The glasses 1610 includes a control device 1612, and an image capturing device corresponding to the image capturing device 1602 and a display device are mounted on the control device 1612. The image capturing device in the control device 1612 and an optical system configured to project light emitted from the display device are formed in a lens 1611, and an image is projected to the lens 1611. The control device 1612 functions as a power supply that supplies power to the image capturing device and the display device, and controls the operations of the image capturing device and the display device. The control device may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The display device according to the embodiment of the present invention can include an image capturing device including a light receiving element, and a displayed image on the display device can be controlled based on the line-of-sight information of the user from the image capturing device.

More specifically, the display device can decide a first visual field region at which the user is gazing and a second visual field region other than the first visual field region based on the line-of-sight information. The first visual field region and the second visual field region may be decided by the control device of the display device, or those decided by an external control device may be received. In the display region of the display device, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the display device, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the display device, the image capturing device, or an external device. If the external device holds the AI program, it is transmitted to the display device via communication.

When performing display control based on line-of-sight detection, smartglasses further including an image capturing device configured to capture the outside can preferably be applied. The smartglasses can display captured outside information in real time.

The individual terms described in this specification are merely used for the purpose of explaining the present invention, and the present invention is not limited to the strict meanings of the terms and can also incorporate their equivalents.

The above-described embodiments are merely specific examples of implementing the present invention, and the interpretation of the technical scope of the present invention should not be limited to them. That is, the present invention can be implemented in various forms without departing from its technical spirit or its main features.

According to the present invention, even if the electrodes of the wiring board are compression-bonded while deviating with respect to the terminals of the element substrate, it is possible to reduce a conductive failure between the element substrate and the wiring board.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-069265, filed Apr. 15, 2021, which is hereby incorporated by reference herein in its entirety.

What is claimed is:

1. A semiconductor device comprising:
   a first substrate;
   a functional element arranged on a main surface of the first substrate;
   a terminal connected to an electrode electrically connected to the functional element and arranged on a second substrate different from the first substrate;
   an insulating portion configured to cover an end of the terminal; and
   a conductive film arranged on the terminal and the insulating portion and containing a conductive particle,
   wherein in a cross-section of the semiconductor device perpendicular to the main surface of the first substrate, the insulating portion includes a top and lateral sides inclined with respect to the top, and a width of the top is smaller than a diameter of the conductive particle.

2. The device according to claim 1, wherein a shape of the insulating portion in the cross-section is a trapezoidal shape.

3. The device according to claim 1, wherein a shape of the insulating portion in the cross-section is a triangular shape.

4. The device according to claim 1, wherein a shape of the insulating portion in the cross-section is a semicircular shape.

5. The device according to claim 1, wherein a shape of the insulating portion in the cross-section is an elliptic shape.

6. The device according to claim 1, wherein in a shape of the insulating portion in the cross-section, the lateral sides include a first inclined portion contacting the terminal and a second inclined portion connected to the first inclined portion, and
   an inclination of the first inclined portion with respect to the top is different from an inclination of the second inclined portion with respect to the top.

7. The device according to claim 1, wherein the device includes a plurality of insulating portions that have a plurality of kinds of shapes in the cross-section.

8. The device according to claim 1, wherein when viewing from an upper surface of the semiconductor device, the insulating portion and the electrode of the second substrate overlap each other.

9. The device according to claim 1, wherein a plurality of terminals are arranged.

10. The device according to claim 9, wherein a pitch between adjacent terminals among the plurality of terminals is not larger than 30 µm.

11. The device according to claim 1, wherein a sealing film is provided on the functional element, and is continuously arranged to the insulating portion.

12. The device according to claim 1, further comprising a lens structure provided on the functional element,
    wherein the insulating portion is made of the same material as a material of the lens structure.

13. The device according to claim 1, further comprising an insulating layer provided under the terminal,
    wherein the insulating portion has an elastic modulus lower than an elastic modulus of the insulating layer.

14. The device according to claim 1, further comprising an insulating layer provided under the terminal,
    wherein the insulating portion has water permeability lower than water permeability of the insulating layer.

15. A display device comprising a plurality of pixels,
    wherein at least one of the plurality of pixels includes a semiconductor device defined in claim 1, and a transistor connected to the semiconductor device.

16. An image capturing device comprising an optical unit including a plurality of lenses, an image sensor configured to receive light having passed through the optical unit, and a display unit configured to display an image captured by the image sensor,
    wherein the display unit includes a semiconductor device defined in claim 1.

17. An electronic apparatus comprising a display unit including a semiconductor device defined in claim 1, a housing provided with the display unit, and a communication unit provided in the housing and configured to perform external communication.

18. The device according to claim 1, wherein an angle between a normal to the top of the section and the lateral side is between 30° and 70°.

* * * * *